United States Patent
Zhang et al.

(10) Patent No.: US 11,121,218 B2
(45) Date of Patent: Sep. 14, 2021

(54) GATE-ALL-AROUND TRANSISTOR STRUCTURE

(71) Applicant: International Business Machines Corporation, Armonk, NY (US)

(72) Inventors: Jingyun Zhang, Albany, NY (US); Takashi Ando, Eastchester, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/683,894

(22) Filed: Nov. 14, 2019

(65) Prior Publication Data
US 2021/0151566 A1    May 20, 2021

(51) Int. Cl.
| | |
|---|---|
| H01L 29/10 | (2006.01) |
| H01L 29/267 | (2006.01) |
| H01L 29/78 | (2006.01) |
| H01L 29/66 | (2006.01) |
| H01L 29/423 | (2006.01) |
| H01L 29/49 | (2006.01) |

(52) U.S. Cl.
CPC ........ H01L 29/1037 (2013.01); H01L 29/267 (2013.01); H01L 29/42392 (2013.01); H01L 29/4958 (2013.01); H01L 29/66795 (2013.01); H01L 29/785 (2013.01); H01L 2029/7858 (2013.01)

(58) Field of Classification Search
CPC ................ H01L 29/42392; H01L 29/785
See application file for complete search history.

(56) References Cited

U.S. PATENT DOCUMENTS

| | | | |
|---|---|---|---|
| 9,929,245 B2 | 3/2018 | Colinge | |
| 9,935,014 B1* | 4/2018 | Cheng | ............ H01L 21/823412 |
| 10,008,583 B1 | 6/2018 | Rodder | |
| 10,026,652 B2 | 7/2018 | Wang | |
| 10,056,454 B2 | 8/2018 | Kim | |
| 2016/0204195 A1* | 7/2016 | Wen | ................. H01L 29/66439 |
| | | | 257/347 |
| 2017/0162442 A1 | 6/2017 | Sun | |
| 2018/0337094 A1 | 11/2018 | Chiang | |
| 2018/0350935 A1 | 12/2018 | Bao | |
| 2019/0006462 A1 | 1/2019 | Guillorn | |

* cited by examiner

*Primary Examiner* — Farun Lu
(74) *Attorney, Agent, or Firm* — David K. Mattheis; Maeve M. Carpenter

(57) ABSTRACT

A semiconductor device and method of forming the same including a plurality of vertically aligned semiconductor channel layers disposed above a substrate layer, a gate stack formed on, and around the vertically aligned semiconductor channel layers and source and drain elements disposed in contact with sidewalls of the vertically aligned semiconductor channel layers. An uppermost vertically aligned semiconductor channel layer has a first thickness of semiconductor material and the remaining vertically aligned semiconductor channel layers have a second thickness of semiconductor material different from the first thickness.

10 Claims, 8 Drawing Sheets

GATE-ALL-AROUND TRANSISTOR STRUCTURE

BACKGROUND

The disclosure relates generally to gate-all-around (GAA) transistor structures. This disclosure relates particularly to GAA transistor structures having reduced threshold voltage variability.

Gate-all-around (GAA) vertical stacked field effect transistors (VFET) may include a stack of semiconductor nanosheets encased in a work function metal (WFM), as part of the gates of the structures. These structures may be used as part of device downscaling efforts.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device including a plurality of vertically aligned semiconductor channel layers disposed above a substrate layer, a gate stack formed on, and around the vertically aligned semiconductor channel layers and source and drain elements disposed in contact with sidewalls of the vertically aligned semiconductor channel layers. An uppermost vertically aligned semiconductor channel layer has a first thickness of semiconductor material and the remaining vertically aligned semiconductor channel layers have a second thickness of semiconductor material different from the first thickness.

In one aspect, a method of forming a semiconductor device includes forming a stack of alternating channel layers and sacrificial layers on a substrate layer, forming source and drain structures at ends of the channel layers, etching away the sacrificial layers exposing channel layer surfaces, and forming gate stacks on and around the channel layers. The top layer and the bottom layer are sacrificial layers. The top channel layer has a first thickness. Each other channel layer has a second thickness, and each sacrificial layer has a third thickness.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
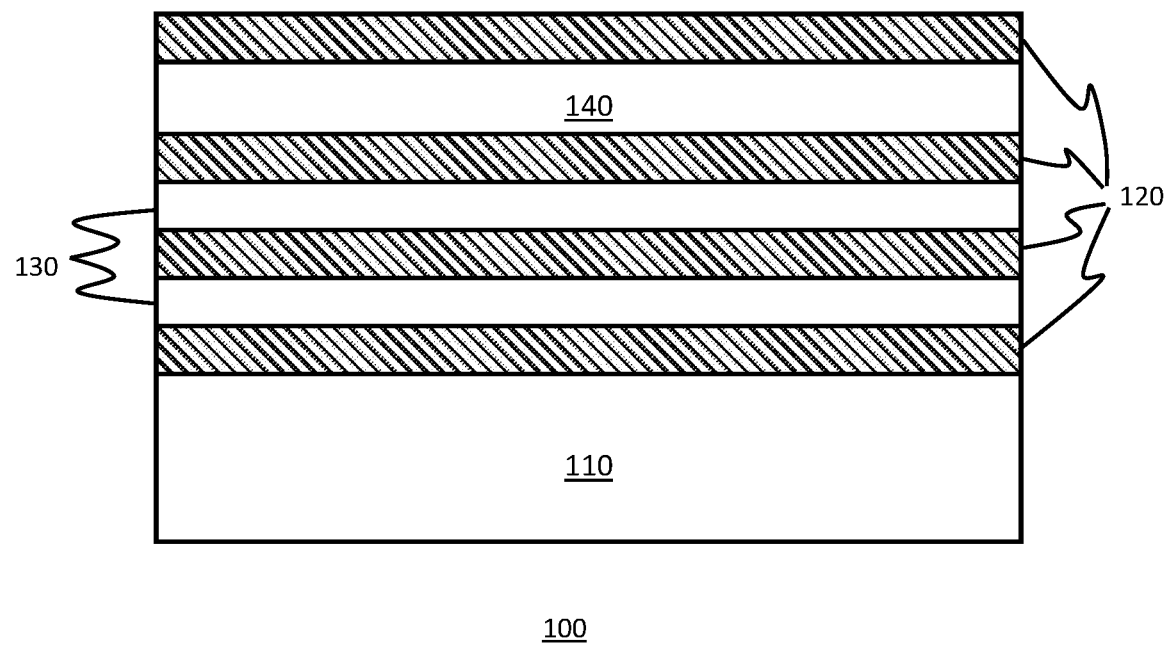
FIG. 1 provides a cross-sectional view of a step in the fabrication of a semiconductor device, according to an embodiment of the invention. The figure illustrates a formed stack of alternating sacrificial and channel layers disposed on a substrate.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials, and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The following description includes gate-all-around (GAA) semiconductor devices having a plurality of semiconductor channel layers aligned in a vertical stack. The channel layers are evenly separated. The uppermost channel layer has a first thickness determined according to the final upper work function metal thickness and the type of work function metal utilized in the device. The remaining channel layers have a second thickness, different from the first thickness.

Determining the uppermost channel layer thickness according to the upper work function metal layer thickness and work function metal type, reduces the device threshold voltage variability across channels associated with structures having uniform channel layer thicknesses.

Reference is now made to the figures, in which identical reference numbers refer to the same or similar elements. FIG. 1 illustrates a cross-sectional view of a device at an early stage in the method of forming the device. The semiconductor structure 100 of FIG. 1 includes a semiconductor material stack of vertically aligned alternating layers of a sacrificial semiconductor material layer 120 and a semiconductor channel material layer 130, and 140, wherein the semiconductor material stack is located on a topmost surface of a semiconductor substrate 110.

In the present application, the semiconductor material stack is used in providing vertically stacked and suspended semiconductor channel material nanosheets for a pFET or nFET device.

The semiconductor substrate 110 may include any semiconductor material including, for example, silicon. The term "semiconductor material" is used throughout the present application to denote a material that has semiconducting properties. Besides silicon, the semiconductor material may be strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof.

The semiconductor material stack is then sequentially formed upon the semiconductor substrate 110. As mentioned above, the semiconductor material stack includes sacrificial semiconductor material layers 120 and semiconductor channel material layers 130 which alternate one atop the other. As shown in the figure, semiconductor channel material layer 140 is the uppermost semiconductor channel material layer and is capped by a final sacrificial semiconductor material layer 120. In FIG. 1 and by way of one example, the semiconductor material stack includes four sacrificial semiconductor material layers 120, two semiconductor channel material layers 130, and one semiconductor channel material layer 140. The semiconductor material stack that can be employed in the present application is not limited to the specific embodiment illustrated in FIG. 1. Instead, the semiconductor material stack can include any number of sacrificial semiconductor material layers 120 and corresponding semiconductor channel material layers 130, and one semiconductor channel material layer 140, so long as the semiconductor material stacks includes at least three sacrificial semiconductor material layers 120, one semiconductor channel material layers 130, and one semiconductor channel material layer 140.

Each sacrificial semiconductor material layer 120 is composed of a first semiconductor material which differs in composition from at least an upper portion of the semiconductor substrate 110, and is resistant to Ge condensation as described herein. In one embodiment, the upper portion of the semiconductor substrate 110 is composed of silicon, while each sacrificial semiconductor material layer 120 is composed of a silicon germanium alloy. In such an embodiment, the SiGe alloy that provides each sacrificial semiconductor material layer 120 has a germanium content that is less than 50 atomic percent germanium. In one example, the SiGe alloy that provides each sacrificial semiconductor material layer 120 has a germanium content from 20 atomic percent germanium to 40 atomic percent germanium. The first semiconductor material that provides each sacrificial semiconductor material layer 120 can be formed utilizing an epitaxial growth (or deposition process) as defined in greater detail herein below.

Each semiconductor channel material layer 130, and 140, is composed of a second semiconductor material that has a different etch rate than the first semiconductor material of the sacrificial semiconductor material layers 120 and is also resistant to Ge condensation. The second semiconductor material of each semiconductor channel material layer 130 and 140, may be the same as, or different from, the semiconductor material of at least the upper portion of the semiconductor substrate 110. The second semiconductor material can be a SiGe alloy provided that the SiGe alloy has a germanium content that is less than 50 atomic percent germanium, and that the first semiconductor material is different from the second semiconductor material.

In one example, at least the upper portion of the semiconductor substrate 110 and each semiconductor channel material layer 130 and 140 is composed of Si or a III-V compound semiconductor, while each sacrificial semiconductor material layer 120 is composed of a silicon germanium alloy. The second semiconductor material of each semiconductor channel material layer 130 and 140, can be formed utilizing an epitaxial growth (or deposition process) as defined in greater detail herein below.

The layers of channel material and sacrificial material 130, 140 and 120, may be formed on the substrate 110 by any appropriate deposition process. For example, the alternating layers may be formed by alternating deposition processes including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Each sacrificial semiconductor material layer 120, may have a thickness from about 5 nanometers (nm) to about 15 nm, while each semiconductor channel material layer 130 and 140, may have a thickness from about 7 to about 15 nm. In an embodiment, each sacrificial semiconductor material layer 120 has an identical thickness, each semiconductor layer 130 has an identical thickness and semiconductor channel material layer 140 has a thickness which differs from semiconductor channel material layers 130.

Figure 2:
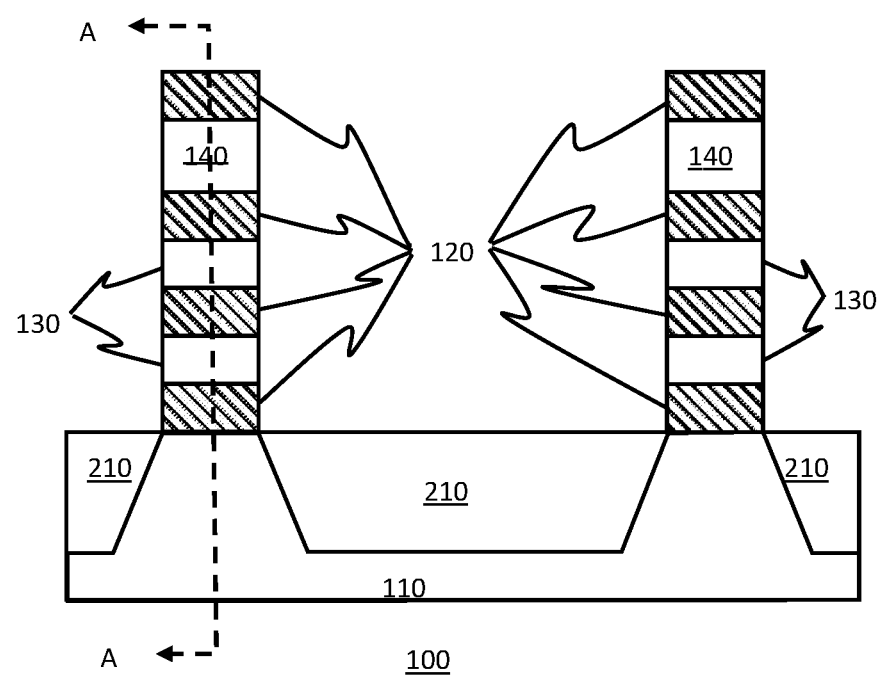
FIG. 2 provides a cross-sectional view of a step in the fabrication of a semiconductor device, according to an embodiment of the invention. The figure illustrates etched stacks of alternating layers of sacrificial and channel layers and the addition of a shallow trench isolation layer to the device.

Reference is now made to FIG. 2, illustrating a step in the formation of the semiconductor devices of an embodiment of the invention. FIG. 2 illustrates stacks of vertically aligned sacrificial semiconductor material layers 120, and semiconductor channel material layers 130 and 140. The stacks of sacrificial semiconductor material layers 120, and semiconductor channel material layers 130 and 140, are formed by, for example, a photolithographic patterning and etching process that removes exposed portions of the sacrificial semiconductor material layers 120, and semiconductor channel material layers 130 and 140, to form the stacks of layers. This etching can be performed using a timed anisotropic etch such as reactive ion etching (RIE). The etch can be performed in a single etch that removes material from both the channel layers 130, 140, and the sacrificial layers 120 or may, alternatively, be performed using alternating etching processes that selectively affect the channel layers 130, 140, and the sacrificial layers 120 in turn. As used herein, the term "selective" in reference to a material removal process denotes that the rate of material removal for a first material is greater than the rate of removal for at least another material of the structure to which the material removal process is being applied.

FIG. 2 also illustrates shallow trench isolation (STI) regions 210 adjacent to the stacks of sacrificial semiconductor material layers 120, and semiconductor channel material layers 130 and 140. The STI regions 210 can be formed by, any suitable process including, for example, lithography or etching to form trenches, and then filling the trenches with an insulating material, such as silicon dioxide. Following the deposition of the STI material, an additional etching process can be performed to remove portions of the STI material and expose the stacks of layers 120, 130, and 140.

Figure 3:
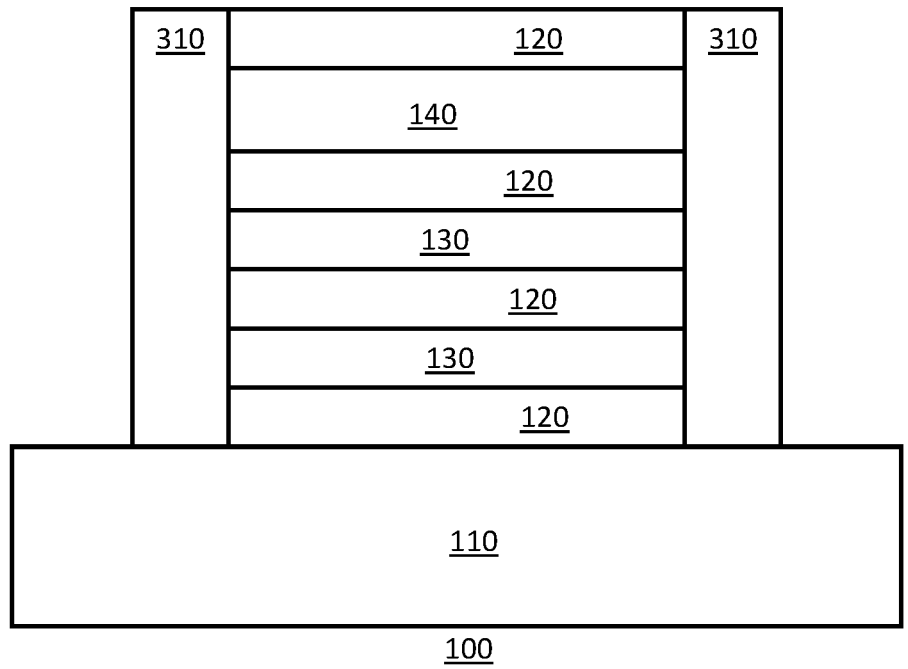
FIG. 3 provides a cross-sectional view along section line A-A of FIG. 2, of a step in the fabrication of a semiconductor device, according to an embodiment of the invention. The figure illustrates the addition of source-drain regions at the ends of the stacks of alternating layers of the device.

Reference is now made to FIG. 3, illustrating a step in the formation of the semiconductor devices of an embodiment of the invention. As shown in FIG. 3, source and drain regions 310 have been epitaxially grown adjacent to the sidewalls of layers 120, 130, and 140. After growth, the source-drain regions 310 may be trimmed to an appropriate shape and size.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the source-drain regions 310 may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous. In one embodiment, a bottom dielectric isolation layer is disposed upon the substrate after the removal of the bottom sacrificial layer and before the epitaxial growth of the source-drain regions. In this embodiment, the bottom dielectric isolation layer comprises silicon dioxide or other suitable dielectric material.

Figure 4:
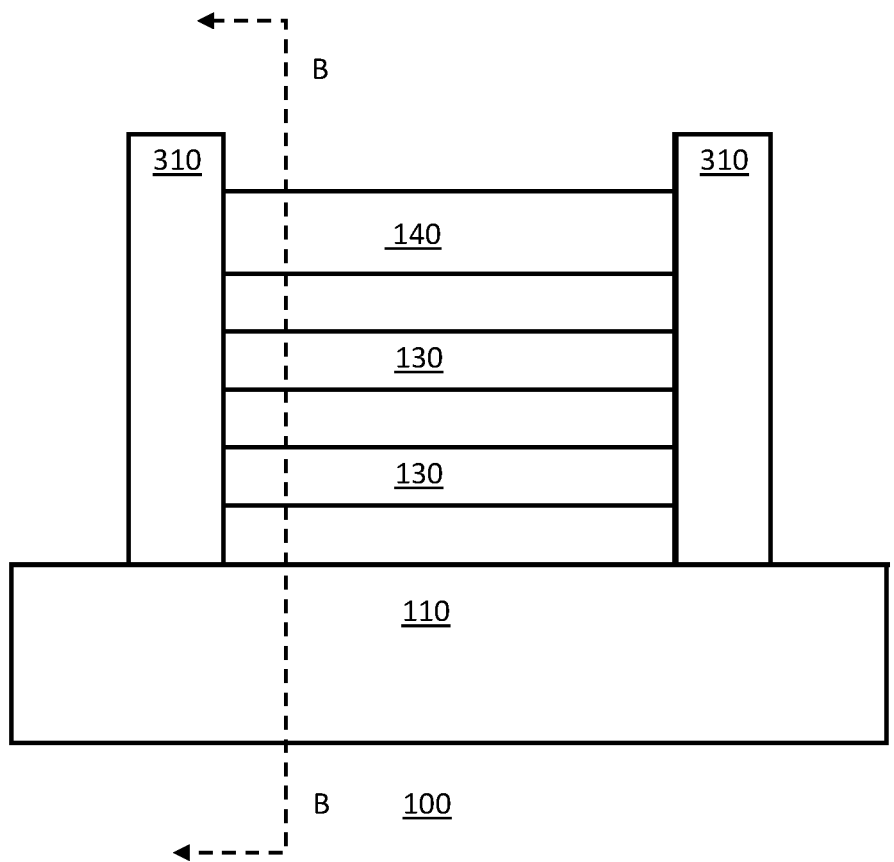
FIG. 4 provides a cross-sectional view of a step in the fabrication of a semiconductor device, according to an embodiment of the invention. The figure illustrates the device after the removal of the sacrificial layers.

Reference is now made to FIG. 4, illustrating a step in the formation of the semiconductor devices of an embodiment of the invention. As shown in the figure, sacrificial semiconductor material layers 120 have been removed. Semiconductor channel material layers 130 and 140, are suspended between source-drain regions 310. In an embodiment, sacrificial semiconductor material layers 120 are etched away using an isotropic etch, such as a wet or dry chemical etch selective to the sacrificial semiconductor material. The removal of sacrificial semiconductor material layers 120 leave gaps between the substrate 110 and the lowest semiconductor channel material layer 130, as well as gaps between adjacent semiconductor material layers 130, and between the uppermost semiconductor channel material layer 130 and semiconductor channel material layer 140.

Figure 5:
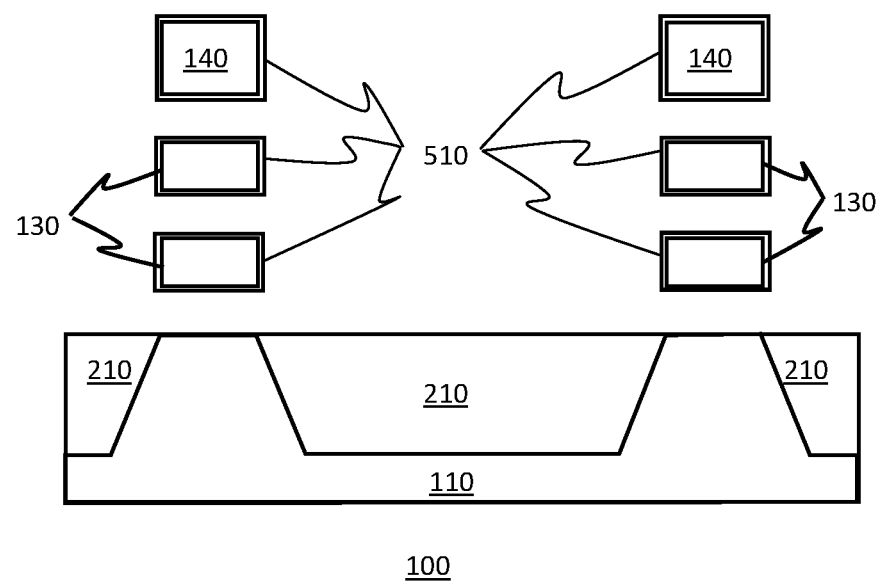
FIG. 5 provides a cross-sectional view along section line B-B of FIG. 4, of a step in the fabrication of a semiconductor device, according to an embodiment of the invention. The figure illustrates the device after the addition of a gate dielectric layer.

Reference is now made to FIG. 5, illustrating a step in the formation of the semiconductor devices of an embodiment of the invention. As shown in the figure, a gate dielectric material 510, has been disposed on and around semiconductor channel material layers 130 and 140. The gate dielectric layer 510 may be formed from any appropriate dielectric material, but it is specifically contemplated that high-k dielectric materials may be used.

As used herein, "high-k" denotes a dielectric material featuring a dielectric constant (k) higher than the dielectric constant of silicon dioxide. The high-k gate dielectric layer 510, can include at least one metallic element. Some examples of high-k dielectric materials suitable for the gate dielectric layer 510 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobite, and combinations thereof. In an embodiment, the gate dielectric layer 510 is disposed using a deposition method as described above. In one embodiment, the gate dielectric layer 510 has a thickness that ranges from about 1 nm to about 4 nm. In another embodiment, the gate dielectric layer 510 has a thickness that ranges from about 1.5 nm to about 2 nm.

Figure 6:
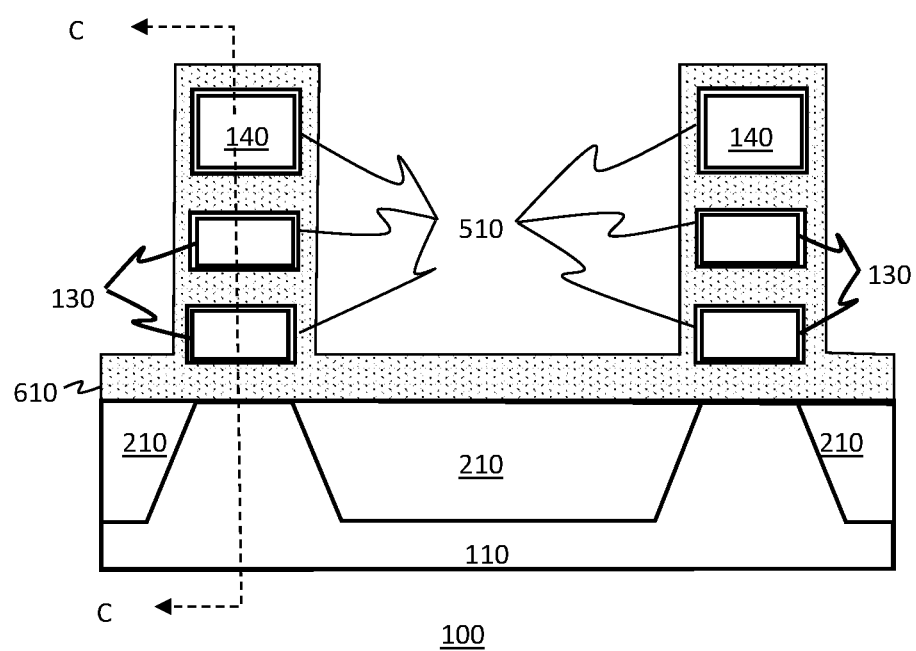
FIG. 6 provides a cross-sectional view of a step in the fabrication of a semiconductor device, according to an embodiment of the invention. The figure illustrates the device after the deposition of a gate work function metal layer.

Reference is now made to FIG. 6, illustrating a step in the formation of the semiconductor devices of an embodiment of the invention. As shown in the figure, gate formation is complete with the addition of a work function metal layer 610, the semiconductor device. In an embodiment, work function metal layer 610 is disposed using ALD as described above. Work function layer 610 may comprise metals, such as tungsten, nickel, titanium, molybdenum, tantalum, copper, platinum, silver, gold, ruthenium, iridium, rhenium, and rhodium and alloys thereof including titanium-aluminum and titanium-nitride alloys, and doped semiconductor materials such as, e.g., doped polysilicon. In an embodiment, work function metal layer 610 comprises multiple layers of different metals.

Figure 7:
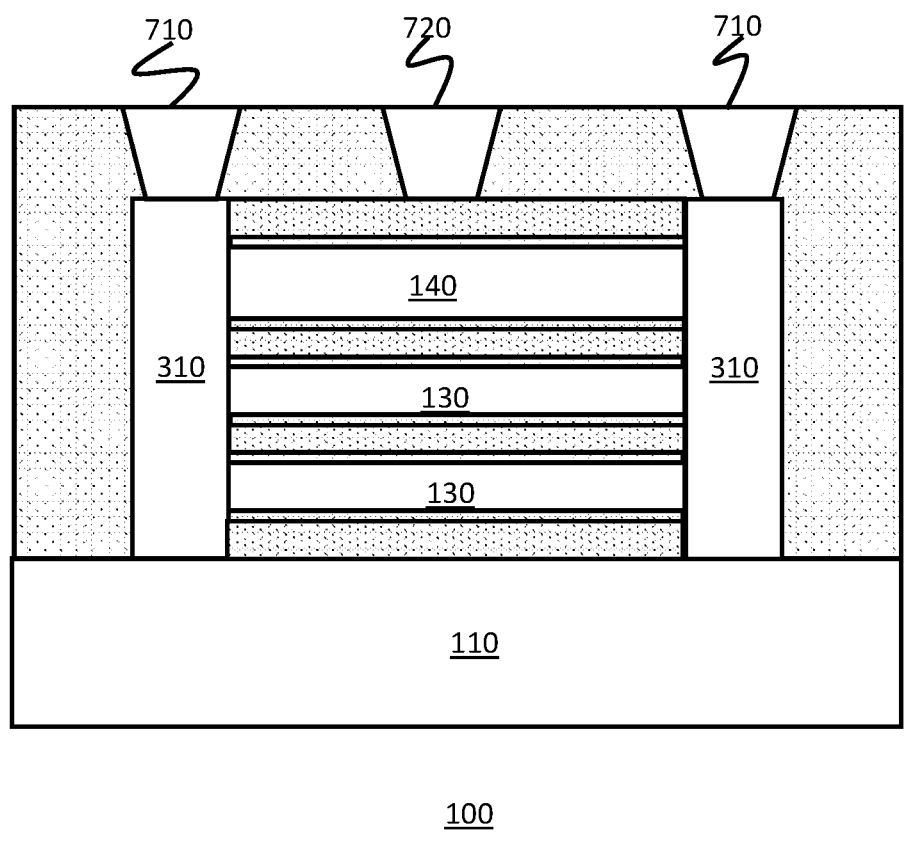
FIG. 7 provides a cross-sectional view along section line C-C of FIG. 6, of a step in the fabrication of a semiconductor device, according to an embodiment of the invention. The figure illustrates the device after the addition of gate and source-drain contacts.

Reference is now made to FIG. 7, illustrating a step in the formation of the semiconductor devices of an embodiment of the invention. As shown in the figure, a layer of passivating dielectric 710 (or inter-layer dielectric) is deposited over the device structure. It is specifically contemplated that the passivating dielectric 710 may be, e.g., silicon dioxide, but any other appropriate dielectric material may be used instead. Openings in the passivating dielectric 710 are formed using, for example, any appropriate anisotropic etch. Gate contacts 720 and source-drain contacts 730 are then formed in the openings to provide electrical connectivity to the gate 610 and to the source-drain regions 310.

In an embodiment, the thickness of semiconductor channel material layer 140 is determined according to the type of work function metal and the intended thickness of the upper layer of the work function metal layer 610. In this embodiment, the thickness of semiconductor channel material layer 140 compensates for threshold voltage variability associated with the work function film layer 610, thickness and the formed corner of the work function film layer 610.

Figure 8:
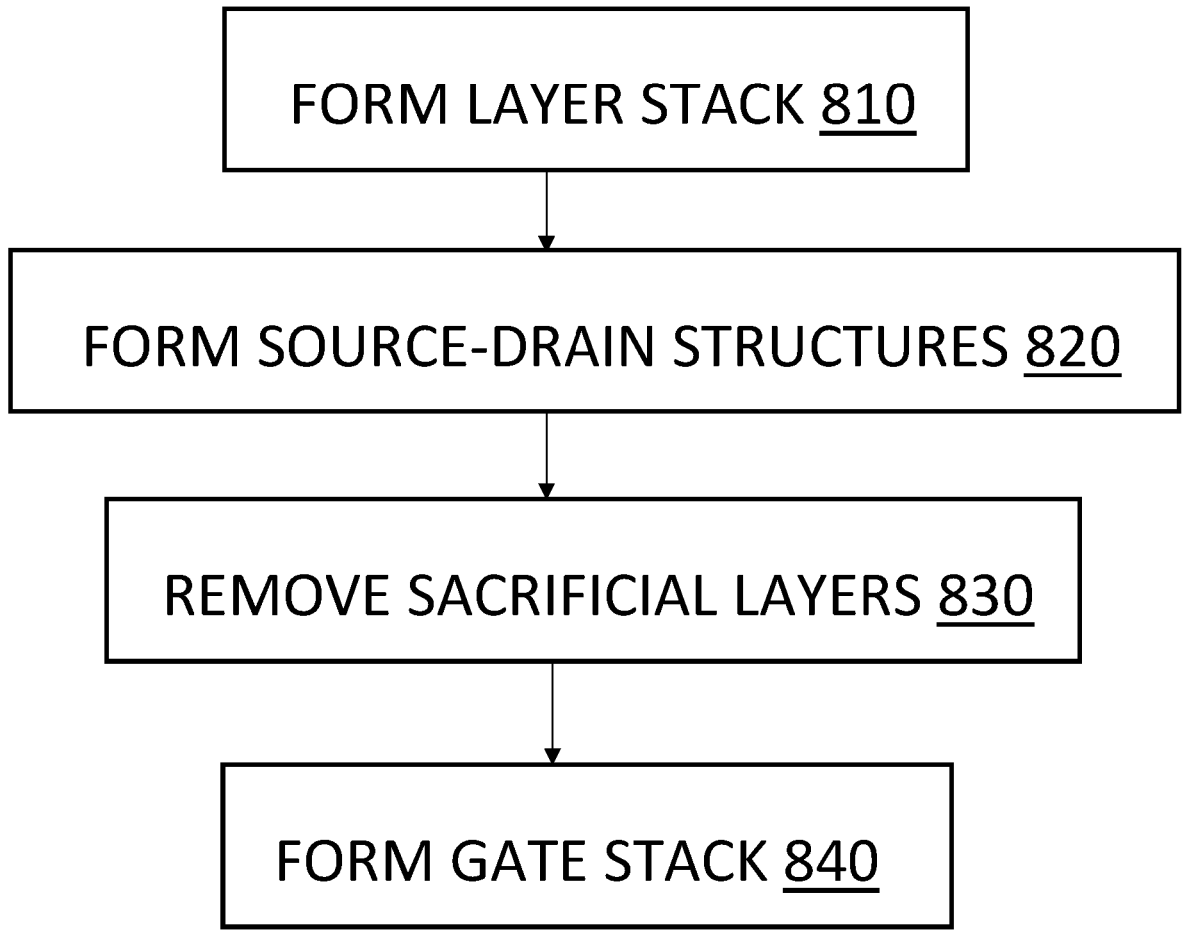
FIG. 8 provides a flowchart depicting the steps of a semiconductor device fabrication method, according to an embodiment of the invention.

Reference is now made to FIG. 8, a flowchart depicting steps of a method of forming semiconductor devices according to an embodiment of the invention. As shown in the figure, at 810, the method deposits material and forms a stack of vertically aligned, alternating sacrificial and channel layers. The stack begins and ends with a sacrificial layer. The sacrificial layers are of uniform thickness. The uppermost channel layer has a thickness which differs from that of the other channel layers. At 820, in an embodiment, the method epitaxially grows source-drain regions adjacent to ends of the vertically aligned stacked layers. At 830, the method removes the sacrificial layers. In an embodiment, the sacrificial layers are removed by selective etching. After the removal of the sacrificial layers, the lowest channel layer is separated from the substrate by a first distance, each subsequent channel layer is separated from the channel layer below it by the same first distance. At 840, gate stacks are formed on and around the channel layers. The gate stacks include an interface dielectric and a work function metal layer. In an embodiment, the interface layer comprises a high-k dielectric. In an embodiment, the work function metal layer comprises titanium.

What is claimed is:

1. A semiconductor device comprising:
   a plurality of vertically aligned semiconductor channel layers disposed above a substrate layer;
   a gate stack formed on, and around the vertically aligned semiconductor channel layers;
   source and drain elements disposed in contact with sidewalls of the vertically aligned semiconductor channel layers;
   a layer of work function metal encasing the plurality of vertically aligned semiconductor channel layers and
   wherein an uppermost vertically aligned semiconductor channel layer comprises a first thickness of semiconductor material and the other vertically aligned semiconductor channel layers comprises a second thickness of semiconductor material different from the first thickness, the layer of work function metal comprising a third thickness above the uppermost semiconductor channel layer, wherein the first thickness is determined according to the third thickness and the work function metal type.

2. The semiconductor device according to claim 1 wherein the first thickness of semiconductor material is greater than the second thickness of semiconductor material.

3. The semiconductor device according to claim 1 wherein the first thickness of semiconductor material is less than the second thickness of semiconductor material.

4. The semiconductor device according to claim 1 further comprising uniform layers of high-k dielectric material and work function metal on and around each of the plurality of vertically aligned semiconductor channel layers.

5. The semiconductor device according to claim 1 wherein a bottom vertically aligned semiconductor channel layer is disposed a first distance above the substrate layer, and wherein each subsequent vertically aligned semiconductor channel layer of the other plurality of vertically aligned semiconductor channel layers is disposed the first distance above the semiconductor channel layer below that vertically aligned semiconductor channel layer.

6. The semiconductor device according to claim 1 wherein the vertically aligned semiconductor channel layers comprise silicon.

7. The semiconductor device according to claim 1 further comprising a titanium-aluminum alloy work function metal layer encasing the vertically aligned plurality of semiconductor channel layers.

8. The semiconductor device according to claim 1 further comprising a titanium-nitride alloy work function metal layer encasing the vertically aligned plurality of semiconductor channel layers.

9. The semiconductor device according to claim 1 wherein the layer of work function metal comprises a plurality of metal layers.

10. A semiconductor device comprising:
    a plurality of vertically aligned semiconductor channel layers disposed above a substrate layer;
    a gate stack formed on, and around the vertically aligned semiconductor channel layers; and
    a layer of work function metal encasing the plurality of vertically aligned semiconductor channel layers and
    wherein an uppermost vertically aligned semiconductor channel layer comprises a first thickness of semiconductor material and each of the other vertically aligned semiconductor channel layers comprises a second thickness of semiconductor material different from the first thickness, the layer of work function metal comprising a third thickness above the uppermost semiconductor channel layer, wherein the first thickness is determined according to the third thickness and the work function metal type.

* * * * *